United States Patent [19]
Jung et al.

[11] Patent Number: 5,384,736
[45] Date of Patent: Jan. 24, 1995

[54] DATA OUTPUT CIRCUIT OF A SEMICONDUCTOR MEMORY DEVICE

[75] Inventors: Chul-Min Jung, Seoul; Young-Ho Suh, Kyungki, both of Rep. of Korea

[73] Assignee: Samsung Electronics Co., Ltd., Kyungki, Rep. of Korea

[21] Appl. No.: 143,895

[22] Filed: Nov. 1, 1993

[30] Foreign Application Priority Data

Oct. 30, 1992 [KR] Rep. of Korea ............... 1992-20208

[51] Int. Cl.6 .............................................. G11C 7/00
[52] U.S. Cl. ..................... 365/189.05; 365/189.07; 365/190; 365/202; 327/51
[58] Field of Search ............ 365/189.02, 189.07, 365/189.09, 190, 202, 189.05; 307/530

[56] References Cited
U.S. PATENT DOCUMENTS 4,858,195  8/1989  Soneda .................. 307/530
5,268,872  12/1993  Fujii et al. .............. 365/189.07

*Primary Examiner*—Joseph A. Popek
*Assistant Examiner*—F. Niranjan
*Attorney, Agent, or Firm*—Robert A. Westerlund; Stephen R. Whitt; Charles R. Donohoe

[57] ABSTRACT

A data output circuit of a semiconductor memory device matches an equalizing level of voltages at data lines in a pair with a logic threshold voltage of data output buffers. The data output circuit having an equalizing transistor connected between first and second nodes connected to the outputs of a sense amplifier, includes a threshold voltage control circuit disposed between the sense amplifier and the data output buffers for allowing a threshold voltage of the data output buffers to match with the equalizing level of the voltages at the first and second nodes. The threshold voltage control circuit has the same structure and characteristics as that of the output buffers, so as to ensure that the logic threshold voltage of the data output buffers matches with the equalizing level of the voltages at the first and second nodes.

15 Claims, 4 Drawing Sheets

5,384,736

DATA OUTPUT CIRCUIT OF A SEMICONDUCTOR MEMORY DEVICE

BACKGROUND OF THE INVENTION

This invention relates generally to a data output circuit of a semiconductor memory device and, more particularly to a circuit for matching an equalizing level of data lines in a pair with a logic threshold voltage of data output buffers.

Generally, data is read out and written from/into a memory cell of a semiconductor memory device by selecting a word line and a bit line, and then transferred to the exterior of a chip. The data read out is amplified by a sense amplifier and then, is output to the exterior via a data output circuit.

Referring to FIG. 1, shown is a conventional data output circuit for outputting data stored on the memory cell to the exterior of the chip. The data stored on the memory cell 1 is amplified by a sense amplifier 2. The data output from the sense amplifier 2 is input to circuits 3 and 5 each having four MOS transistors controlled by a pair of selection control signals MSi and/MSi. The circuits 3 and 5 are respectively configured to have two PMOS transistors (3a, 3b; 5a, 5b) connected in series to the power supply voltage Vcc and two NMOS transistors (3c, 3d; 5c, 5d) connected in series to the ground voltage Vss. In case of the circuit 3, if the selection control signal MSi and the data on the line 1 are at the logic "high", the PMOS transistor 3a and the NMOS transistors 3c, 3d are all turned on and the PMOS transistor 3b is turned off, so that a voltage at a first node NO1 goes to the logic "low". On the contrary, a voltage at a second node /NO1 goes to the logic "high". To increase a sensing speed of the data, the voltages at the first and second nodes NO1 and /NO1 are initially equalized by an NMOS transistor 11 upon receiving an address transition detection pulse PEQ (i.e., an equalizing signal) at a gate thereof.

If a buffer enable signal PIO of the logic "low" is applied to first and second data output buffers each comprised of NAND gates 13 and 15, the outputs of the NAND gates 13 and 15 are both at the logic "high". Thus, the voltages at third and fourth nodes NO2, /NO2 go to the logic "low" and accordingly, pull-up and pull-down NMOS transistors 17 and 19 are both turned off. However, if the buffer enable signal PIO goes to the logic "high", the outputs of the NAND gates 13 and 15 become "high" and "low" respectively and as a result, the NMOS transistors 17 and 18 are respectively turned off and turned on. Thus, the output data becomes at the logic "low".

However, when the equalizing levels of the first and second nodes NO1 and/NO1 do not match with a logic threshold voltage (or a triggering voltage) of the first and second data output buffers 13 and 15, problems are raised which will be explained hereinbelow with reference to FIGS. 2A and 2B.

Referring first to FIG. 2A, shown is a case where the equalizing level of the voltages at the first and second nodes NO1 and/NO1 is set to be higher than the logic threshold voltage of the data output buffers 13 and 15. In this case, when the potential difference between the first and second nodes NO1 and/NO1 is not developed (i.e., the voltages at NO1 and/NO1 are equalized), the input voltages of the respective nodes NO1 and/NO1 may be both misrecognized as the logic "high". At this moment, if the buffer enable signal PIO changes to the logic "high", the NMOS transistors 17 and 19 are both turned on, resulting in a realoperation of the data output circuit.

Referring to FIG. 2B, illustrated is a case where the equalizing level of the voltages at the first and second nodes NO1 and/NO1 is lower than the logic threshold voltage of the data output buffers 13 and 15. In this case, it takes longer for a potential at the first or second node NO1,/NO1 to become at the logic "high" level, upon receiving data from the sense amplifier 2. Accordingly, the operation time of the data output buffers 13 and 15 is delayed after the buffer enable signal PIO enabled to the logic "high", reducing the overall operation speed of the data output circuit. A letter "L" representing the data output time interval (time delay) of FIG. 2B is normally 2ns. Thus, it is needed to match the equalizing level of the data lines in a pair with the logic threshold voltage of the data output buffers. However, it becomes extremely difficult to match them since the equalizing level of the voltages at the data lines varies according to the various process parameters of the memory device.

SUMMARY OF THE INVENTION

It is therefore an object of the present invention is to provide a data output circuit used for a semiconductor memory capable of preventing malfunctions during a data read operation, and outputting a data output at high speed.

It is another object of the present invention to provide a data output circuit used for a semiconductor memory device capable of outputting data at high speed, irrespective of a mismatching of an equalizing level of the voltages at the data lines with a logic threshold voltage of data output buffers.

It is also another object of the present invention to provide a data output circuit used for a semiconductor memory device capable of minimizing an operation time delay and preventing a glitch phenomenon.

According to an aspect of the present invention, a data output circuit of a semiconductor memory device having an equalizing transistor connected between first and second nodes connected to the outputs of a sense amplifier, includes a threshold voltage control circuit disposed between the sense amplifier and data output buffers for allowing a threshold voltage of the data output buffers to match with the equalizing level of the voltages at the first and second nodes. The threshold voltage control circuit has the same structure and characteristics as that of the output buffers, so as to ensure that the threshold voltage of the data output buffers matches with the equalizing level of the voltages at the first and second nodes. Further, the threshold voltage control circuit includes a NAND gate receiving the voltage at the first or second node in response to a chip enable signal, and an NMOS transistor responding to the equalizing signal, connected between the input and output of the NAND gate.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 3:
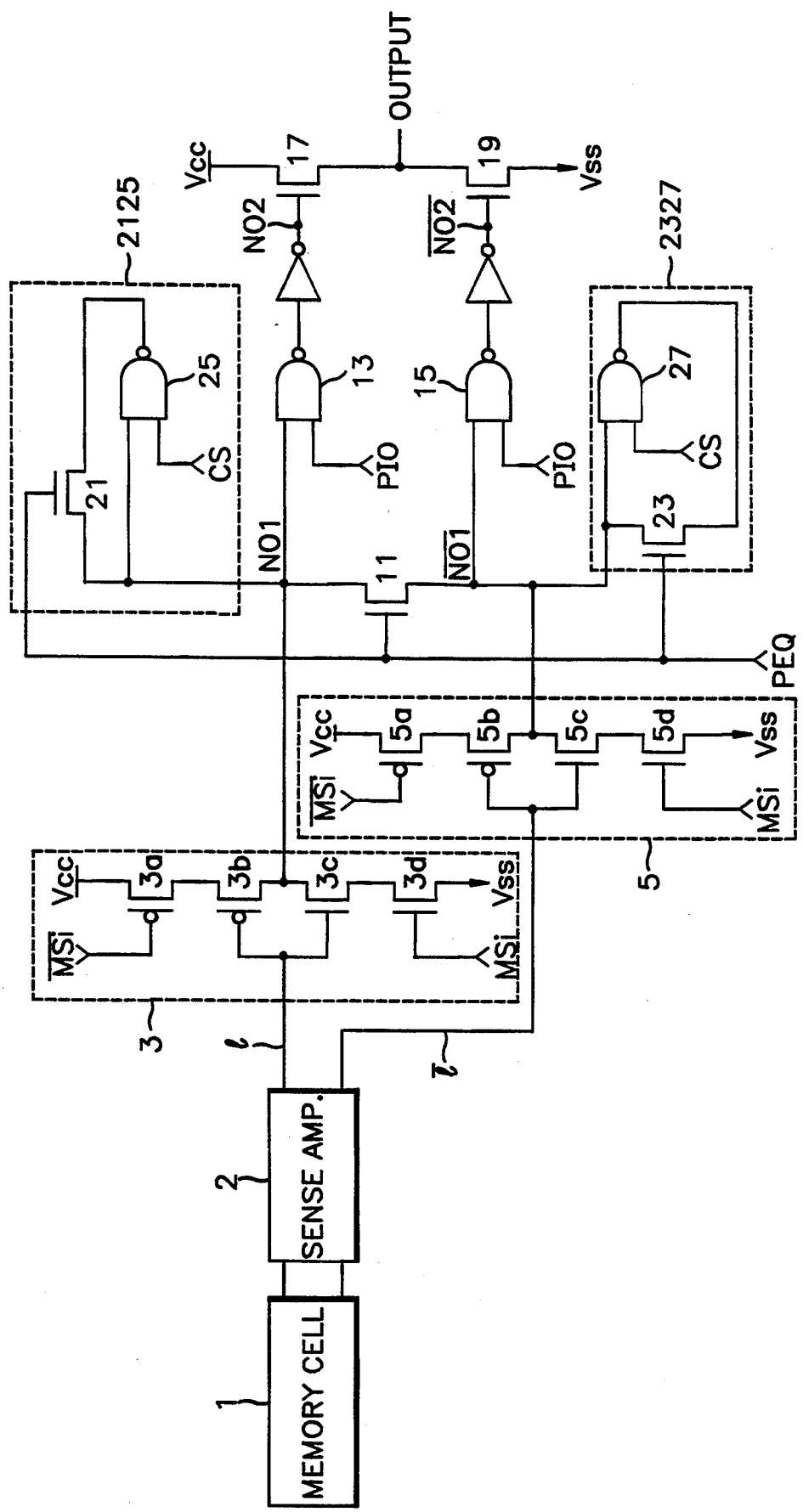
FIG. 3 illustrates a data output circuit according to the present invention.
Figure 4A:
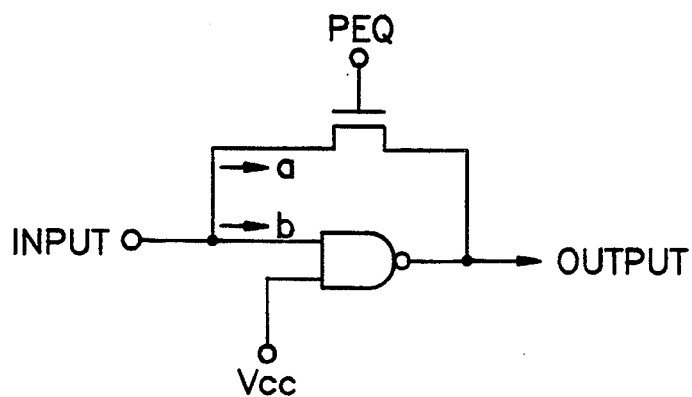
FIG. 4A illustrates a threshold voltage control circuit according to the present invention; voltage control circuit of FIG. 4A.
Figure 4B:
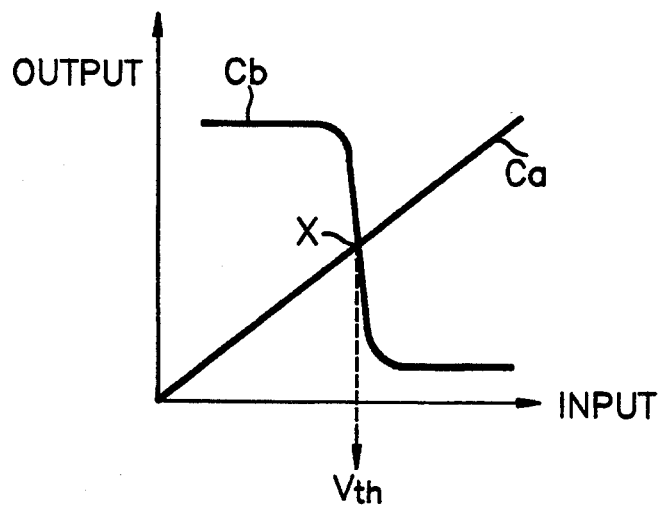
FIG. 4B is a curve showing an input-output characteristic of the threshold voltage control circuit of FIG. 4A.

Referring to FIG. 3 and FIGS. 4A and 4B, complementary input signals generated from a sense amplifier 2 are input to first and second data output buffers 13, 15 each comprised of a NAND gate, and also provided to first and second threshold voltage control circuits 2125 and 2327 for controlling the voltage levels of first and second nodes NO1 and/NO1 to become the same as a logic threshold voltage level of the first and second data output buffers 13 and 15. An equalizing transistor 11 comprised of an NMOS transistor receives an equalizing signal PEQ through a gate thereof. A channel of the equalizing transistor 11 is formed between input terminals of the first and second data output buffers 13 and 15. It should be noted that the equalizing transistor 11 comprised of an NMOS transistor in this embodiment can be substituted with a PMOS transistor by inverting the logic state of the equalizing signal PEQ. The first and second threshold voltage control circuits 2125 and 2327 are respectively connected to first and second nodes NO1 and/NO1. Further, NAND gates 25 and 27 respectively constituting the first and second threshold voltage control circuits 2125 and 2327 have the same structure and characteristics as that of the first and second data output buffers 13 and 15, so that the logic threshold voltages of the NAND gates 25 and 27 are the same as those of the first and second data output buffers 13 and 15. Each of the NAND gates 25 and 27 receives a chip enable signal CS of the power supply voltage level. The NMOS transistors 21 and 23 commonly receive the equalizing signal PEQ and the channels thereof are respectively connected between the first node NO1 and the output of the NAND gate 25 and between the second node/NO1 and the output of the NAND gate 27.

Operations according to the embodiment of the present invention will be explained. If the equalizing signal PEQ is at the logic "high", the equalizing transistor 11 and the NMOS transistors 21 and 23 are all turned on. The voltage of the first node NO1 is applied both to the first data output buffer 13 and to the NAND gate 25 of the first threshold voltage control circuit 2125. However, while the equalizing signal PEQ is enabled, the buffer enable signal PIO is disabled and therefore the first and second data output buffers 13 and 15 are disabled. Similarly, the NAND gate 27 of the second threshold voltage control circuit 2327 and the second data output buffer 15 commonly receive the voltage at the second node/NO 1. By the equalization operation, the voltages of the first and second nodes NO1 and/NO1 become at the same level. Thereafter, if the chip enable signal CS changes to the logic "high", the NAND gates 25 and 27 are enabled. Then, the outputs of the NAND gates 25 and 27 are supplied to the first and second nodes NO1 and/NO1 via the NMOS transistors 21 and 23, respectively. Accordingly, the voltages at the points where the load line a (see FIG. 4A) of the NMOS transistors 21 and 23 meets the load line b of the NAND gates 25 and 27 determine the voltages of the first and second nodes NO1 and /NO1. In more detail, it is noted that the chip enable signal CS and the voltages at the first and second nodes NO1 and/NO1 are respectively fed-back to the input terminals of the NAND gates 25 and 27; thus, the voltages at the first and second nodes NO1 and/NO1 can be determined according to the voltages of the first and second nodes NO1 and/NO1 themselves.

If, for example, the voltage at the first node NO1 is at the level lower than a logic threshold voltage of the NAND gate 25, the output of the NAND gate 25 becomes at the logic "high". Alternatively, if the voltage at the first node NO1 is higher than the logic threshold voltage of the NAND gate 25, the output of the NAND gate 25 becomes the logic "low". It is therefore understood that the load line b of the NAND gate 25 changes rather drastically around the logic threshold voltage of the NAND gate 25. However, since the NMOS transistors 21 and 23 receive the equalizing signal PEQ through gates thereof, they remains turned on during the equalizing period, so that the voltages at the output terminals of the NAND gates 25 and 27 change linearly with respect to the input voltages on the line a (or the nodes NO1 and/NO1). However, in case where the logic "low" level lower than the logic threshold voltage of the NAND gates 25 and 27 is input to the NAND gates 25 and 27 and the outputs thereof go to the logic "high", because the outputs of the NMOS transistors 21 and 23 are connected to the respective outputs of the NAND gates 25 and 27, the logic "high" output of the NAND gates 25 and 27 increases the input levels (the voltages at the first and second nodes NO1 and/NO1) of the NAND gates 25 and 27 via the NMOS transistors 21 and 23. This operation continues until the voltages at the first and second nodes NO1 and/NO1 increase up to the level of the logic threshold voltage of the NAND gates 25 and 27. When the voltages at the first and second nodes NO1 and/NO1 reach the logic threshold voltage of the NAND gates 25 and 27, the outputs of the NAND gates 25 and 27 become at the logic "low" and the voltages at the first and second nodes NO1 and/NO1 are no longer increased, because the voltages at both ends of the channels of the respective NMOS transistors 21 and 23 become the same to each other at a certain point X (see FIG. 4B). That is, the voltages at the first and second nodes NO1 and/NO1 are determined at the logic threshold voltages of the NAND gates 25 and 27.

Figure 1:
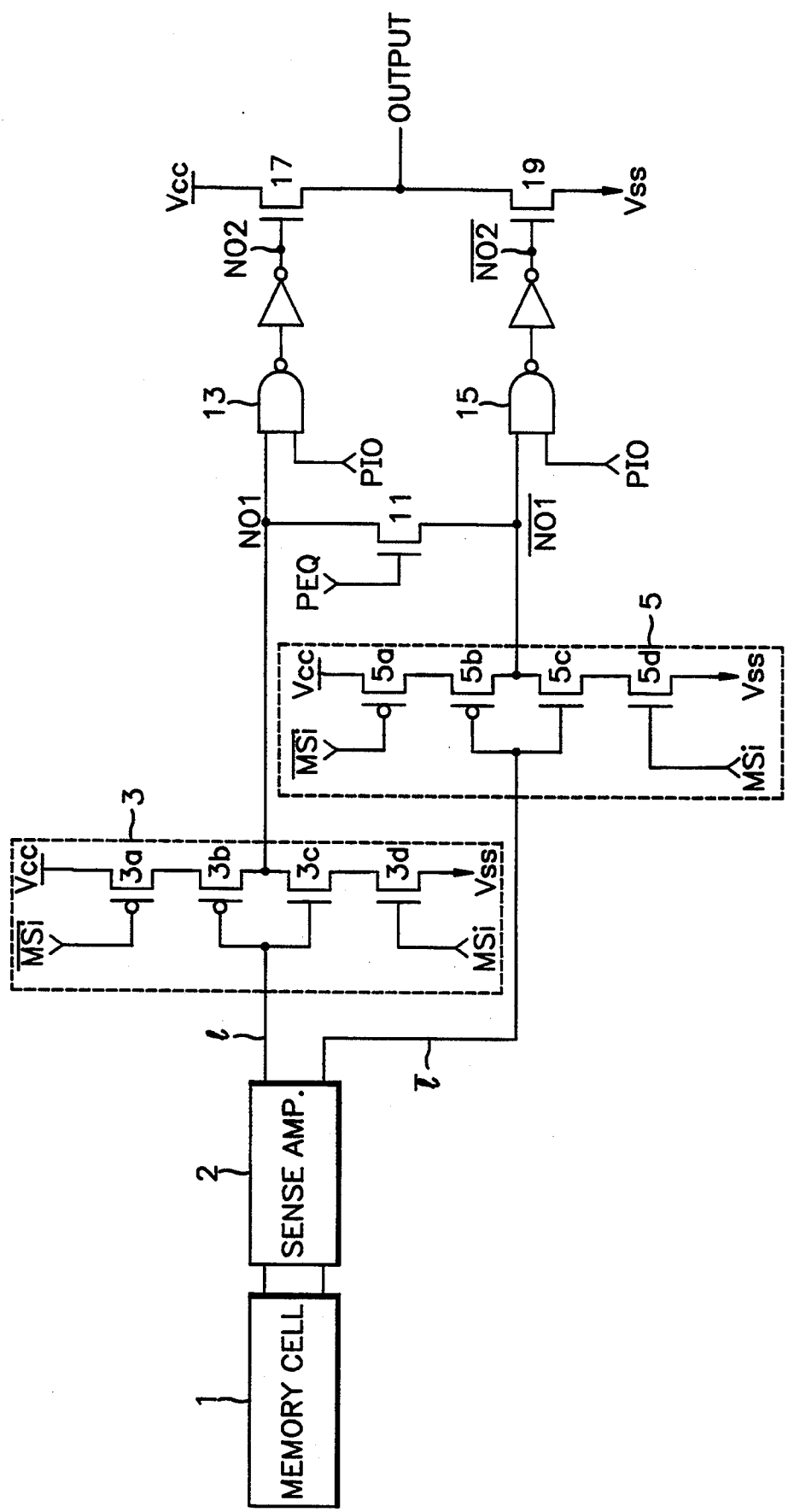
FIG. 1 illustrates a data output circuit of a memory device according to a prior art.
Figure 2A:
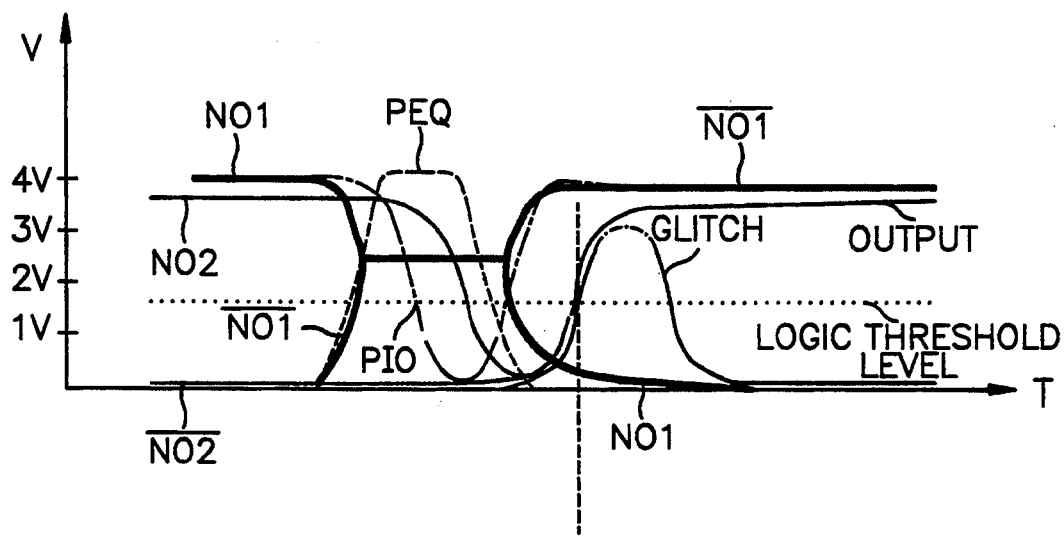
FIGS. 2A and 2B are diagrams illustrating operation waveforms of FIG. 1.
Figure 2B:
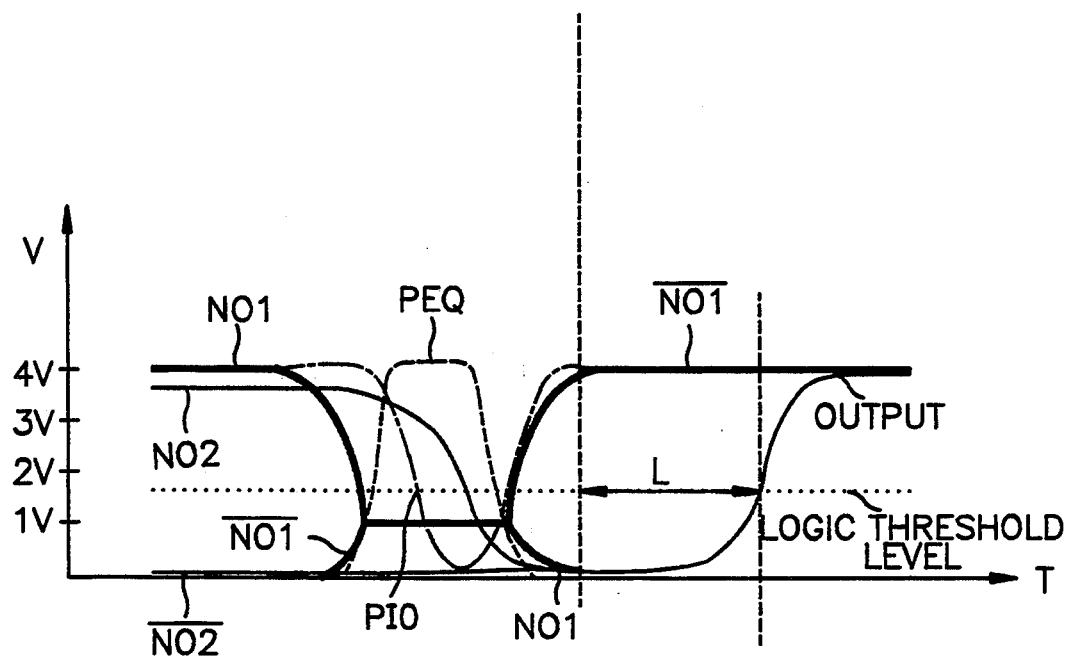
Figure 5:
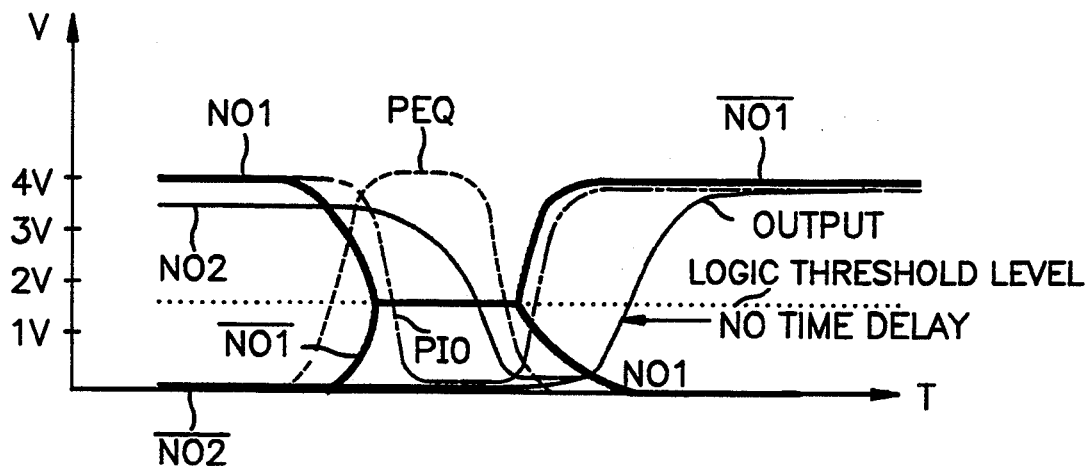
FIG. 5 is a diagram illustrating operation waveforms of FIG. 3.

As described so far and illustrated in FIG. 4B, the characteristic curves Ca and Cb each representing the voltages at the load lines a and b meet each other at the logic threshold voltage Vth of the NAND gates 25 and 27. The voltage at the conjunction X becomes the equalizing levels of the first and second nodes NO1 and/NO1. It is further noted that since the NAND gates 25 and 27 have the same structure and characteristics as that of the data output buffers 13 and 15, the threshold voltage of the data output buffers 13 and 15 are the same as that of the NAND gates 25 and 27. As a result, the equalizing levels of the first and second nodes NO1 and/NO1 become the same as the logic threshold voltage of the data output buffers 13 and 15. After the equalizing level had been determined, the equalizing signal PEQ is disabled, the buffer enable signal PIO is enabled, and the chip enable signal CS are disabled, thereby fixing voltages at the first and second nodes NO1 and/NO1 to the logic threshold voltage level of the data output buffers 13 and 15. Thereafter, the data output from the sense amplifier 2 is transferred to the first and second nodes NO1 and/NO1. Then, since the logic threshold voltage of the data output buffers 13 and 15 matches exactly with the equalizing levels of the first and second nodes NO1 and/NO1, only the voltage at either the first node NO1 or the second node/NO1 is recognized as the logic "high" state while the voltage at the other node is recognized as the logic "low"; therefore, only one of the pull-up and pull-down transistors 17 and 19 is selectively enabled. Accordingly, the glitch phenomenon illustrated in FIG. 2A does not occur. Also, the time delay while recognizing the logic "high" by one of the data output buffers 13 and 15 as shown in FIG. 2B is removed. This is illustrated in FIG. 5.

In the examples of the embodiments of the present invention provided so far, only the NMOS transistors and NAND gates have been mentioned as the means for controlling the threshold voltage. However, NOR, AND, OR gates and inverters can be used as long as a threshold voltage of the same level as the threshold voltage of the data output buffers can be provided. In case AND gates are used instead of NAND gates 25 and 27 having the same logic threshold voltage, a chip enable signal SC has a power voltage level. However, in case NOR gates or OR gates are used, the logic "low" signal of the ground level can be used for the chip enable signal SC. Also, PMOS transistors or CMOS transistors can be used instead of NMOS transistors 21 and 23 connected to the output terminal of the NAND gates 25 and 27. The transistors must be turned on during the equalization period.

The threshold voltage controlling circuits 2125 and 2327 of the present invention are disposed between the data output buffers 13 and 27, and the sense amplifier 2, respectively. However, they can be disposed between the sense amplifiers or between the sense amplifier 2 and a multiplexer (not shown) since the present invention can be utilized on any input circuits which receive an equalizing signal.

As previously mentioned, even if the equalizing levels of the first and second nodes are varied according to the process conditions, the equalizing level is adjusted to be matched to the logic threshold voltage level of the data output buffers thereby preventing the malfunctions without the overall sensing speed decreasing.

What is claimed is:

1. A data output circuit of a semiconductor memory device including first data output means, and second data output means for receiving the output of said first data output means and an equalizing signal, comprising:
   threshold voltage controlling means disposed between said first data output means and said second data output means, for matching the output level of said first data output means with the logic threshold voltage of said second data output means, wherein said threshold voltage controlling means comprises:
   a MOS transistor;
   a logic gate having substantially the same channel and the same logic threshold voltage as that of said second data output means;
   an input of said second data output means and an input of said logic gate being coupled in common to an output of said first data output means; and, the channel of said MOS transistor being connected between the output of said first data output means and the output of said logic gate.

2. A data output circuit according to claim 1, wherein said first and second data output means are sense amplifiers and multiplexers, respectively.

3. A data output circuit according to claim 1, wherein said logic gate is a NAND gate or an AND gate that uses a chip enable signal of the power voltage level as an enable signal thereof; wherein a gate of said MOS transistor is provided with the equalizing signal.

4. A data output circuit according to claim 1, wherein said logic gate is a NOR gate or an OR gate using the chip enable signal of the ground voltage level as an enable signal thereof; wherein said MOS transistor is a PMOS transistor with a gate connected to the ground voltage.

5. A data output circuit of a semiconductor memory device having first and second nodes to which first and second data are transferred from a sense amplifier, an equalizing transistor connected between said first and second nodes to equalize the voltages of said first and second nodes in response to an equalizing signal, and first and second data output buffers respectively connected to said first and second nodes to receive the equalized voltages of said first and second nodes in response to a buffer enable signal, comprising;
   threshold voltage controlling means comprising,
      logic gate means whose input is connected to the first and second nodes, for receiving a control signal and the equalized voltages of said first and second nodes; and
      transistor means connected between the output of said logic gate means, said first and second nodes;
   whereby the equalized voltages of said first and second nodes are matched with logic threshold voltages of said first and second data output buffers.

6. A data output circuit according to claim 5, wherein said threshold voltage controlling means allows said equalized voltages to be the same level as the logic threshold voltages of said first and second data output buffers.

7. A data output circuit according to claim 5, wherein said transistor means is responsive to the equalizing signal and the threshold voltage of said logic gate means is the same as that of said first and second data output buffers.

8. A data output circuit according to claim 7, wherein said logic gate means comprises a NAND gate or an AND gate for receiving said control signal of the power voltage level; wherein said transistor means comprises an NMOS transistor with a gate connected to said equalizing signal.

9. A data output circuit according to claim 7, wherein said logic gate means comprises a NOR gate or an OR gate for receiving said control signal of the ground voltage level; wherein said transistor means comprises a PMOS transistor with a gate connected to an inverse signal of said equalizing signal.

10. A data output circuit for a semiconductor memory device, comprising:
   first and second data output lines having first and second nodes, respectively;

an equalizing device connected between said first and second nodes, said equalizing device being responsive to a first control signal to equalize the voltages on said first and second nodes;

a first data output buffer having a first input coupled to said first node and a second input coupled to a second control signal;

a second data output buffer having having a first input coupled to said second node and a second input coupled to said second control signal, wherein said first and second data output buffers have a common logic threshold voltage; and, a threshold voltage control circuit for matching the equalized voltages on said first and second nodes with said common logic threshold voltage of said first and second data output buffers.

11. The data output circuit as set forth in claim 10, wherein said threshold voltage control circuit comprises a first control circuit for controlling the voltage on said first node and a second control circuit for controlling the voltage on said second node.

12. The data output circuit as set forth in claim 11, wherein said first control circuit comprises:

a first logic gate having a first input coupled to said first node, a second input coupled to a third control signal, and an output; and, a first MOS transistor having a first electrode commonly coupled to said first node and said first input of said first logic gate, a second electrode coupled to said output of said first logic gate, and a gate electrode coupled to said first control signal.

13. The data output circuit as set forth in claim 12, wherein said second control circuit comprises:

a second logic gate having a first input coupled to said second node, a second input coupled to said third control signal, and an output; and, a second MOS transistor having a first electrode commonly coupled to said second node and said first input of said second logic gate, a second electrode coupled to said output of said second logic gate, and a gate electrode coupled to said first control signal.

14. The data output circuit as set forth in claim 13, wherein said first and second logic gates have a common threshold voltage equal to said common threshold voltage of said first and second data output buffers.

15. The data output circuit as set forth in claim 14, wherein said first and second logic gates, and said first and second data output buffers, each comprise a NAND gate.

* * * * *